(12) United States Patent
Nagai et al.

(10) Patent No.: US 10,746,307 B2
(45) Date of Patent: Aug. 18, 2020

(54) METHOD OF CONTROLLING A GATE VALVE

(71) Applicant: V-Tex Corporation, Shinagawa-ku, Tokyo (JP)

(72) Inventors: Hideaki Nagai, Hitachinaka (JP); Tomohiro Sawahata, Hitachinaka (JP); Katsuyuki Saitoh, Hitachinaka (JP); Shuichi Araki, Hitachinaka (JP); Yoshinori Tobita, Hitachinaka (JP); Mitsuhiro Ikeda, Hitachinaka (JP)

(73) Assignee: V-Tex Corporation, Tokyo (JP)

( * ) Notice: Subject to any disclaimer, the term of this patent is extended or adjusted under 35 U.S.C. 154(b) by 0 days.

(21) Appl. No.: 16/244,586

(22) Filed: Jan. 10, 2019

(65) Prior Publication Data

US 2019/0346047 A1    Nov. 14, 2019

(30) Foreign Application Priority Data

May 14, 2018 (JP) ................................. 2018-092779

(51) Int. Cl.
*F16K 3/02* (2006.01)
*F16K 51/02* (2006.01)
(Continued)

(52) U.S. Cl.
CPC .............. *F16K 3/0254* (2013.01); *F16K 3/18* (2013.01); *F16K 3/184* (2013.01); *F16K 27/044* (2013.01);
(Continued)

(58) Field of Classification Search
CPC ......... H01L 21/67184; H01L 21/67126; H01L 21/67253; F16K 51/02; F16K 3/184;
(Continued)

(56) References Cited

U.S. PATENT DOCUMENTS 3,783,693 A * 1/1974 Paros ...................... G01L 7/061
                                                     73/701
5,381,996 A * 1/1995 Arnemann .............. F16K 31/12
                                                     137/554

(Continued)

FOREIGN PATENT DOCUMENTS

JP         9-186092 A      7/1997

*Primary Examiner* — Atif H Chaudry
(74) *Attorney, Agent, or Firm* — Crowell & Moring LLP

(57) ABSTRACT

Particle scattering is suppressed only by controlling the gate valve in opening the gate valve with the internal pressure of the chamber being matched to the atmospheric pressure. A method of controlling a gate valve is characterized in that, in a gate valve that presses its valve body to an opening of a chamber by detecting a torque of a motor that drives the valve body, the method comprises the following steps: acquiring in advance a local maximum of the torque at the time of decompressing the inside of the chamber with the valve body closed under the atmospheric pressure, detecting the torque when a vent gas is being introduced into the chamber before returning the inside of the chamber to the atmospheric pressure for opening the valve body, opening the valve body when the torque exceeds the local maximum of the torque so that a clearance is created between the valve body and the opening of the chamber, and opening fully the valve body after the particles are discharged together with the gas inside the chamber.

1 Claim, 5 Drawing Sheets

(51) Int. Cl.
*F16K 3/18* (2006.01)
*H01L 21/67* (2006.01)
*F16K 27/04* (2006.01)
*F16K 31/524* (2006.01)

(52) U.S. Cl.
CPC ........ *F16K 31/52475* (2013.01); *F16K 51/02* (2013.01); *H01L 21/67184* (2013.01); *H01L 21/67126* (2013.01)

(58) Field of Classification Search
CPC ........ F16K 3/0218; F16K 3/18; F16K 27/044; F16K 31/52475
See application file for complete search history.

(56) References Cited

U.S. PATENT DOCUMENTS

2010/0108151 A1\* 5/2010 Duelli ................. F16K 3/18
137/14
2013/0306896 A1\* 11/2013 Nagai ................. F16K 25/00
251/193

\* cited by examiner

[Fig. 1]
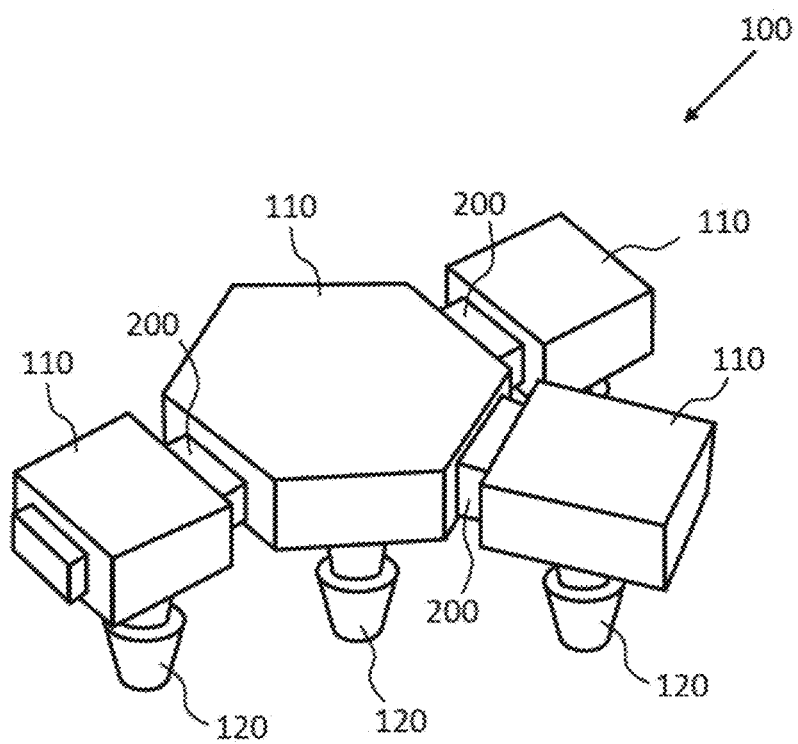

[Fig. 2]
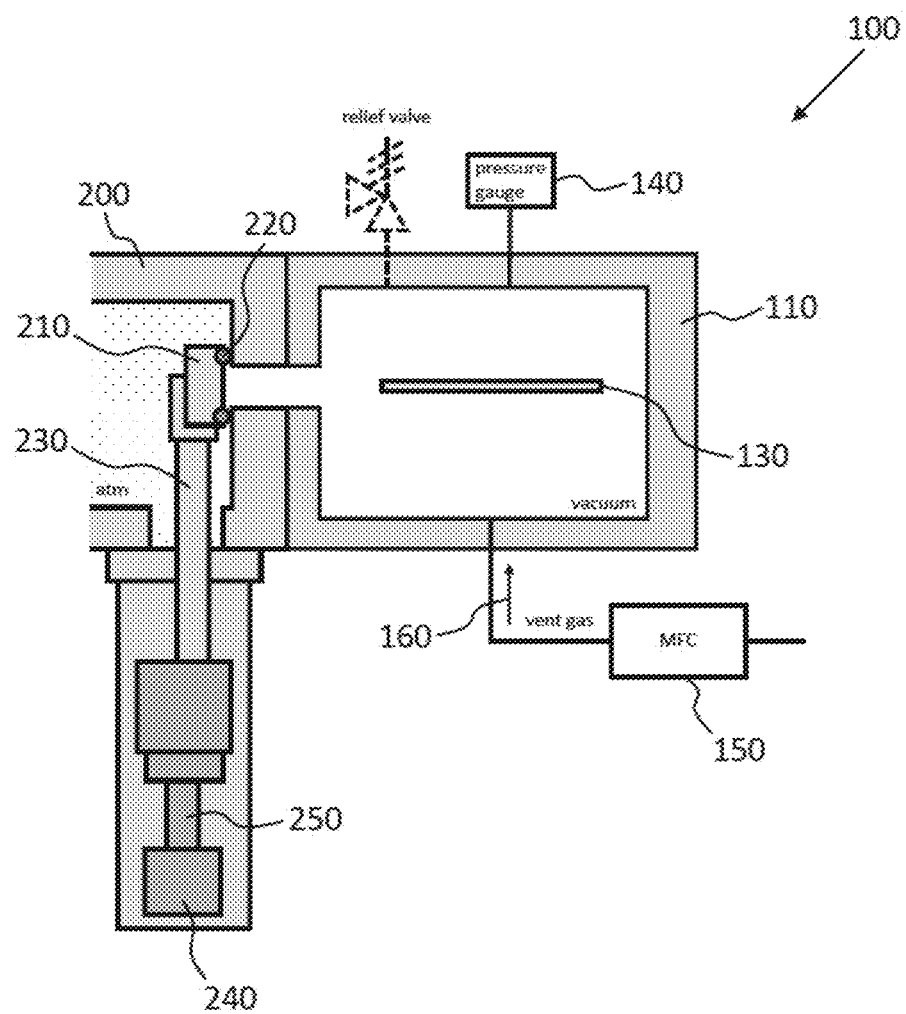

[Fig. 3]
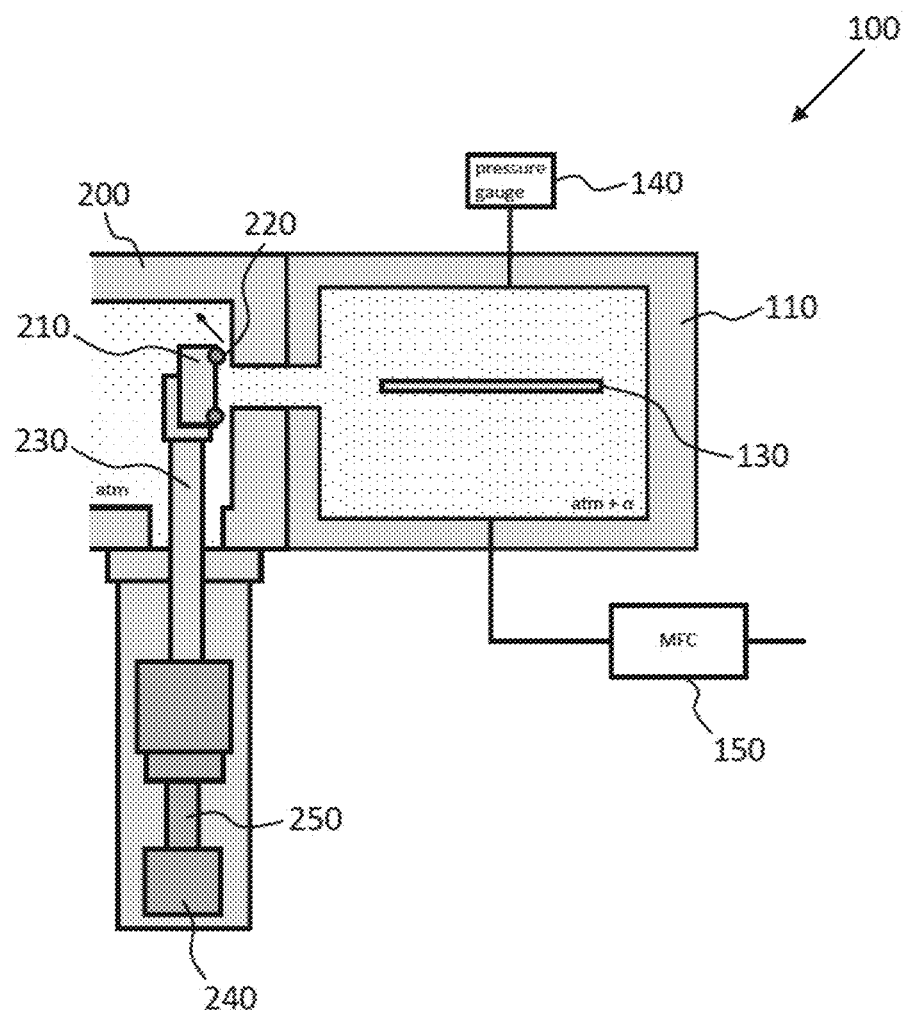

[Fig. 5]
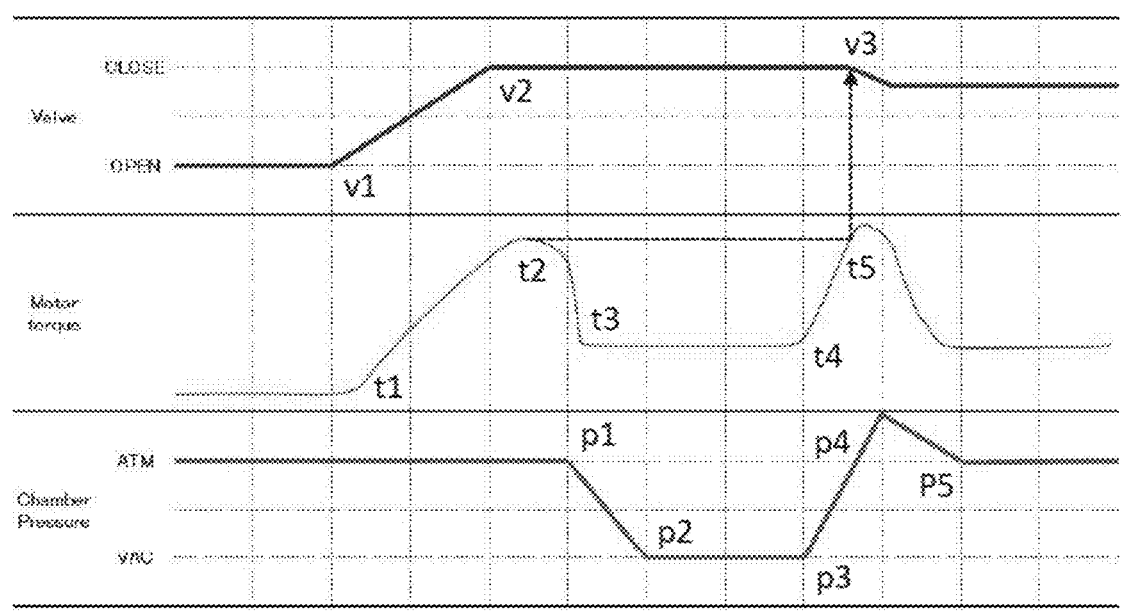

METHOD OF CONTROLLING A GATE VALVE

TECHNICAL FIELD

The present invention relates to a control method when opening a gate valve with a semiconductor manufacturing apparatus released from a vacuum state.

BACKGROUND ART

A semiconductor manufacturing apparatus has plural chambers and a substrate is conveyed into a chamber for processing at each process step. The gate valve separates between chambers. When conveying the substrate, the gate valve is opened and closed. In opening the gate valve, the pressure difference between outside and inside the chamber is made to be eliminated. The pressure inside the chamber is controlled by decompressing with a vacuum pump or supplying a gas.

If pressure difference between the inside and the outside of chambers exists in opening the gate valve, it may risk contaminating the substrate caused from scattering of particles generated inside the chamber. As stated in Patent Literature 1, an invention of a semiconductor manufacturing apparatus is disclosed. That invented apparatus prevents adhesion of particle on a wafer using airflow that occurs when the inside pressure of a reaction chamber is returned to the atmospheric pressure.

LITERATURES OF RELATED ART

Patent Literatures

[Patent Literature 1] Japanese Patent Application Laid-open H9-186092

SUMMARY OF INVENTION

Technical Problems

In the conventional art however, when the inside of the chamber is to be brought to the atmospheric pressure from the vacuum state, a vent gas is introduced while measuring the internal pressure; and if the internal pressure of the camber rises higher than the atmospheric pressure, the relief valve allows the gas to escape therethrough. In this method, simply controlling the gate valve alone cannot deal with the problem. Therefore, an overall control system of the semiconductor manufacturing apparatus is necessary.

In addition, in a method in which the gate valve has a construction such that the valve body is pressed by an air cylinder, the rim of the valve body may bend outward weakening the pressing force of the sealing material incurring gas leak when the internal pressure of the chamber rises. In this case, a risk of particle scattering may arise due to such as vibration when the gate valve is opened, because particles have gathered in the vicinity of the valve body.

An object of the present invention is therefore to suppress the particle scattering by controlling only the gate valve when opening the gate valve with the internal pressure of the chamber made to be matched to the atmospheric pressure.

Solution to Problem

To solve above mentioned problem, the present invention provides a method of controlling a gate valve. The invented method of controlling a gate valve which is such that a valve body is pressed against the opening of a chamber in accordance with the detected torque of a motor that drives the valve body, and the method is comprised of following steps, in any order:

acquiring in advance the local maximum torque of the motor in decompressing inside the chamber by closing the valve body at the atmospheric pressure, detecting the torque while the vent gas is being introduced in the chamber before opening the valve body to return the inside pressure of the chamber to the atmospheric pressure, opening the valve body so that a clearance will be created between the valve body and the opening of the chamber when the torque rises in excess of the maximum torque, discharging particles together with the gas inside the chamber, and opening the valve body fully.

A gate valve of the present invention is characterized in that the gate valve that is controlled by the above-mentioned control method.

Advantageous Effects of Invention

According to the present invention, the risk of contaminating the substrate by particle scattering caused by such as vibration is eliminated even the valve body is fully opened. In the invented method, detecting the torque of the motor that drives the gate valve allows acquiring the inside pressure of the chamber, therefore, when making the inside of the chamber of decompressed state to be matched to the atmospheric pressure state to open the valve body, the valve body is opened very little to discharge the particles together with gas, if the inside pressure of the chamber goes higher than the atmospheric pressure. This eliminates risk of occurrence of substrate contamination due to particle scattering caused from such as vibration, even when the valve body is fully opened after that.

Using the invented method does not require use of a pressure gauge or a relief valve as in the conventional method, because it is not necessary to measure the inside pressure of the chamber with a pressure gauge to let the gas escape through the relief valve when the measured inside pressure of the chamber is higher than the atmospheric pressure. Further, discharging the gas is performed not by weakening the seal of the valve body but by creating a very little clearance between the valve body and the opening of the chamber, which allows not only the gas but also the particles to be discharged to the outside the chamber.

BRIEF DESCRIPTION OF DRAWINGS

FIG. 1 is a perspective view to show a semiconductor manufacturing apparatus to which the gate valve control method of the present invention is applied.

FIG. 2 is a cross sectional view to show a construction of the gate valve to which the gate valve control method of the present invention is applied.

FIG. 3 is a cross sectional view to show a state of the gate valve to which the gate valve control method of the present invention is applied.

FIG. 5 is a graph to chart in time-sequence the torque when the control method of the gate valve of the present invention is applied.

MODE OF IMPLEMENTING INVENTION

Figure 4A:
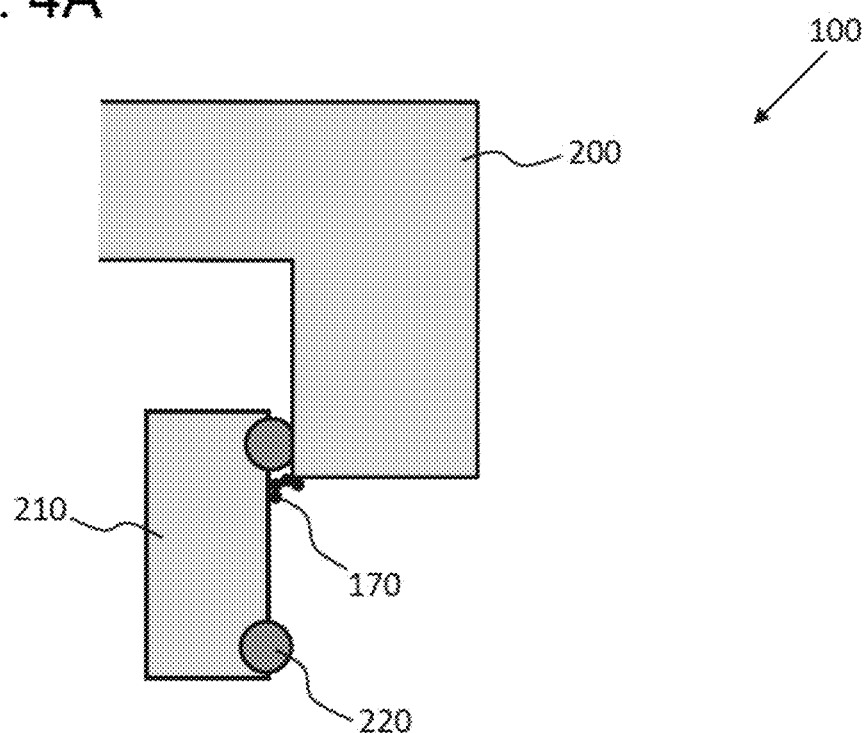
FIGS. 4A and 4B are enlarged views to show the particle discharging state produced by applying the gate valve control method of the present invention.

The following details a mode of implementing the present invention referring to drawings. In addition, where an element having the same function will be given the same numeral but repeated explanation of such element may sometimes be omitted.

Embodiment 1

First, the following describes a semiconductor manufacturing apparatus to which the invented gate valve control method is applied. FIG. 1 is a perspective view of a semiconductor manufacturing apparatus. FIG. 2 is a cross sectional view of a construction of the gate valve that is equipped for the semiconductor manufacturing apparatus.

As FIG. 1 shows, a semiconductor manufacturing apparatus 100, which manufactures semiconductor items, such as solar cells or liquid crystals, through various processes, has a plurality of chambers 110 and a substrate is conveyed to chamber 110 corresponding to each process. For example, in the case of an apparatus of a cluster style configuration, plural chambers are arranged in a stellate configuration around the transfer chamber. Those chambers are a load (or unload) lock chamber serving as a vacuum-preliminary chamber, and a process chamber serving as a room for processing.

Between each of chambers 110, a gate valve 200 is arranged. When conveying a substrate between the chambers 110, the gate valve 200 is opened, and when processing the substrate in the chamber 110, the gate valve 200 is closed. As the substrate, wafers (a semiconductor substrate such as silicon) or glass substrates are the material to be processed. The inside of the chamber 110 is evacuated with a vacuum pump to bring the chamber inside to the vacuum state, then in the chamber, a thin film is formed by vacuum evaporation, spattering, CVD (chemical vapor deposition), etc., and unnecessary portion is removed by etching from the thin film if any.

As FIG. 2 shows, placing a substrate 130 in the chamber 110, closing the opening of the chamber 110 with the gate valve 200, then inside the chamber 110 is brought to a vacuum state. During processing, a vent gas 160 is introduced while decompressing with the vacuum pump. With this the internal pressure of the chamber 110 is maintained to a specified degree of vacuum, wherein the internal pressure of the chamber 110 is checked with a pressure gauge 140, the flow rate of the vent gas 160 is controlled with a mass-flow controller 150, and the opening degree of the vacuum pump is regulated.

Further, after the processing, decompression is not performed but the vent gas 160 is introduced making the internal pressure of the chamber 110 match to the atmospheric pressure, then the gate valve 200 is opened to convey the substrate 130. If the external pressure on the gate valve 200 side is the atmospheric pressure, a pressure of 1 atm (760 Torr) is enough for pressure matching. Conventionally, the internal pressure of the chamber 110 is matched to the atmospheric pressure by letting the vent gas 160 escape through the relief valve if the internal pressure of the chamber 110 measured with the pressure gauge 140 is higher than the atmospheric pressure.

The gate valve 200 has a valve body 210 that is pressed against the opening of the chamber 110, a sealing material 220 that closes the clearance between a valve body 210 and the chamber 110, a stem 230 that supports the valve body 210, a motor 240 that drives the stem 230, and a ball screw 250 that transmits the driving power of the motor 240 to the stem 230.

It is only required that the size of the valve body 210 is to be larger than the opening of the chamber 110 which allows the edge of the valve body 210 to overlap with the rim of the opening. As the sealing material 220, an O-ring made of rubber is used, and it is only required to arrange the sealing material 220 at the place where the edge of the valve body 210 overlaps with the rim of the opening of the chamber 110. Compressing the sealing material 220 closes the clearance to seal the chamber 110.

The stem 230 raises the valve body 210 to press the valve body 210 against the opening of the chamber 110 or lowers the valve body 210 separating from the opening of the chamber 110. When the stem 230 is driven by an air cylinder, the movement of the stem 230 is simply either full-close position or full-open position. However, driving by the motor 240 allows a multiple-position-stopping by position control.

The ball screw 250 converts the rotational movement of the motor 240 to a linear motion and transfers the motion to the stem 230. For pressing the valve body 210 against the opening of the chamber 110 with the stem 230, a servo mechanism is provided for controlling the torque of the motor 240. The servo mechanism follows so that the state of pressing the valve body 210 will satisfy a specified condition, i.e. the amount of the compression of the sealing material 220 satisfies the target compression amount.

When the pressure inside the chamber 110 becomes lower than the atmospheric pressure, the valve body 210 is attracted by suction which lowers the torque of the motor 240. In contrast with this, when the pressure of the inside of the chamber 110 becomes higher than the atmospheric pressure, the torque of the motor 240 increases. Additionally, if the pressure of the chamber 110 is higher than the atmospheric pressure, the vent gas 160 is made to escape.

In a case where a relief valve is provided, measuring the pressure inside the chamber 110 with the pressure gauge 140 and the vent gas 160 is released. In some cases, however, the vent gas 160 is leaked in a way such that: when the internal pressure of the chamber 110 rises, the edge of the valve body 210 deforms outward a little causing the compression of the sealing material 220 to be reduced, which condition allows the vent gas 160 to escape.

Figure 4B:
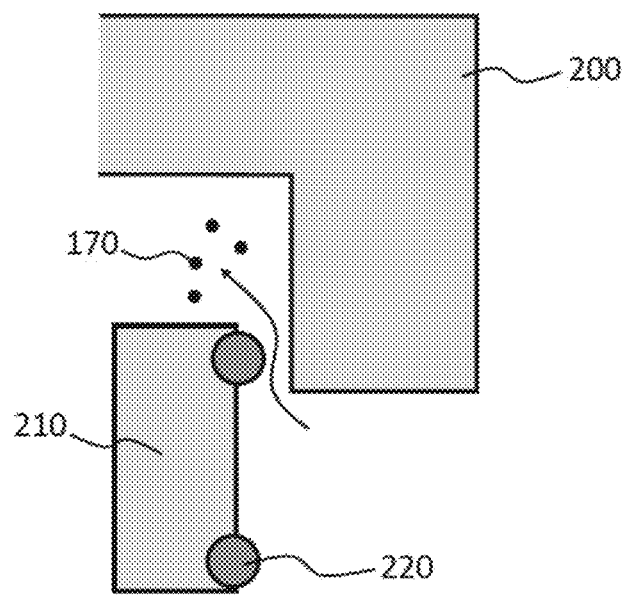

Next, the control method of the gate valve of the present invention is explained. FIG. 3 is a cross sectional view to show a state of the gate valve to which the gate valve control method of the present invention is applied. FIG. 4 is an enlarged view to show the particle discharging state produced by applying the gate valve control method of the present invention. FIG. 5 is a graph to chart in time-sequence the torque when the control method of the gate valve is applied.

As shown in FIG. 3, the torque of the motor 240 is controlled so that the compression amount of the sealing material 220 will be kept constant while the opening of the chamber 110 is closed by the servo mechanism. Where the vent gas 160 is supplied to the chamber 110 in a vacuum state to be matched to the atmospheric pressure, the torque of the motor 240 varies depending on the inner pressure of the chamber 110.

When the detected torque of the motor 240 indicates that the internal pressure of the chamber 110 is higher than the atmospheric pressure, the valve body 210 is opened a little. It is enough that when the degree of this little-opening, a clearance, is able to allow the vent gas 160 and the particles generated inside the chamber 110 to escape therethrough.

When the internal pressure of the chamber 110 becomes equal to the atmospheric pressure as the vent gas 160 is discharged, the substrate 130 is allowed to be conveyed out by fully-opening the valve body 210. The gate valve 200 functions also as a relief valve, therefore a relief valve is unnecessary for the chamber 110.

As shown in FIG. 4 (a), in the gate valve 200 closed state, particles 170 in the chamber 110 may adhere to the valve body 210 or to the sealing material 200. In a case where the vent gas 160 leaks due to a lowered amount of the compression of the sealing material 200, the discharging cannot work for as far as the particles 170.

As shown in FIG. 4 (b), when the valve body 210 is slightly opened, since the sealing material 200 is separated and a clearance has been created, the particles 170, as well, are discharged to the outside of the chamber 110 together with the vent gas 160. The particles 170 adhering on the valve body 210 or the seal member 200 will not be scattered in the chamber 110 due to such as vibrations even if the gate valve 200 is fully opened after the vent gas 160 is discharged.

FIG. 5 is a graph to show in the time-sequence the state of the valve position, the motor torque, and the chamber pressure from the state at the point where the gate valve 200 is full-open state. Shown wherein are states until the state at the point where the inside of the chamber 110 is adjusted to the atmospheric pressure from the state at the point where the chamber 110 is made vacuum by bringing the gate valve 200 in the full-open state to the full-close state. In the initial state, the valve position is full-open, motor torque is nil, and the chamber pressure is the same as the atmospheric pressure.

When an instruction to set the valve position at the full-close position is issued (v1), the motor torque increases because the motor 240 works to move the valve body 210 (t1). In the state that the valve is fully closed (v2), the motor torque shows its maximum (t2) when the valve body 210 is pushed against the opening of the chamber 110 causing the sealing material 220 compressed.

When the inside of the chamber 110 is hermetically sealed and the evacuation is started by the vacuum pump, the chamber pressure begins to decrease (p1), and the motor torque decreases (t3) because the valve body 210 is sucked, conversely, without having to press. When the internal pressure of the chamber reaches vacuum (p2), processing is performed in the chamber 110.

When the vacuum pump is stopped and the vent gas 160 is supplied into the chamber 110 after the processing, the chamber pressure begins to rise (p3), the negative pressure in the chamber 110 becomes weak, and then the motor torque increases (t4) to maintain the pressing by the valve body 210.

When the chamber pressure reaches the atmospheric pressure (p4), the motor torque also becomes the same as the local maximum value (t5). Further, when the chamber pressure becomes larger than the atmospheric pressure, it becomes necessary to press the valve body 210 more and the motor torque also comes to increase.

Therefore, the vent gas 160 is discharged from the chamber 110 by bringing the valve state to the slight-open (v3), thereby the chamber pressure is also adjusted to the atmospheric pressure (p5). As to timing of slight-opening of the gate valve 200, when the internal pressure of the chamber 110 becomes more than the atmospheric pressure, such time may be judged as the timing of the slight-opening. When the internal pressure of the chamber 110 becomes in excess of the atmospheric pressure, the torque for adjusting the internal pressure of the chamber 110 to the atmospheric pressure becomes more than the local maximum. That is, this state of torque indicates that the internal pressure of the chamber 110 is more than the atmospheric pressure. This local maximum of torque is acquired, in advance, when the valve body 210 is closed.

According to the present invention, when matching the internal pressure of the chamber from the decompressed state with the atmospheric pressure to open the valve body, the torque of the motor for driving the valve body of the gate valve is detected to grasp the internal pressure of the chamber. When the detected torque indicates that the pressure inside the chamber becomes higher than the atmospheric pressure based on this detection, the valve body is slightly opened to discharge the particles together with the vent gas. Therefore, even if the valve body is made to open fully after this discharge, there is no risk of contaminating the substrate due to scattering particles caused by vibration or the like.

Different from the conventional art, it is unnecessary to measure the pressure inside the chamber with a pressure gauge and to let the gas escape through the relief valve when the pressure exceeds the atmospheric pressure, therefore a pressure gauge, a relief valve, and similar items come unnecessary. Further, since the valve body is slightly opened so that a clearance is created between the valve body and the opening of the chamber rather than leaking the gas by weakening the sealing of the valve body, it allows discharging not only the gas but also the particles to the outside of the chamber.

Although an embodiment of the present invention has been described above, embodiments are not limited thereto. For example, when a pressure difference exists between inside and outside of a chamber, the invention may be applied to match the pressures inside and outside.

REFERENCE SIGNS LIST

100: Semiconductor manufacturing apparatus
120: Chamber
130: Vacuum pump
140: Substrate
150: Pressure gauge
160: Mass-flow controller
170: Vent gas
200: Particle
210: Gate valve
220: Valve body
230: Sealing material
240: Stem
250: Motor
250: Ball screw

The invention claimed is:

1. A method of controlling a gate valve that presses its valve body to an opening of a chamber by detecting a torque of a motor that drives the valve body, the method comprising the steps of in any order:
acquiring in advance a local maximum of the torque at the time of decompressing the inside of the chamber with the valve body closed under the atmospheric pressure,
detecting the torque when a vent gas is being introduced into the chamber before returning the inside of the chamber to the atmospheric pressure to open the valve body, opening the valve body when the torque exceeds the local maximum of the torque so that a clearance is created between the valve body and the opening of the chamber, and opening fully the valve body after the particles are discharged together with the gas inside the chamber.

\* \* \* \* \*